(12) United States Patent
Giffard et al.

(10) Patent No.: US 7,935,559 B1
(45) Date of Patent: May 3, 2011

(54) METHOD FOR PRODUCING A NON-PLANAR MICROELECTRONIC COMPONENT USING A CAVITY

(75) Inventors: Benoît Giffard, Grenoble (FR); Yvon Cazaux, Grenoble (FR); Norbert Moussy, Sainte Agnes (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 12/913,289

(22) Filed: Oct. 27, 2010

(30) Foreign Application Priority Data

Dec. 22, 2009 (FR) ...................................... 09 59340

(51) Int. Cl.
  *H01L 21/00* (2006.01)

(52) U.S. Cl. .................................. 438/69; 257/E21.189

(58) Field of Classification Search .................... 438/69, 438/71; 257/415, 432 E21.183, E21.189, 257/E21.617
See application file for complete search history.

(56) References Cited

U.S. PATENT DOCUMENTS

| 7,390,687 B2 | 6/2008 | Boettiger et al. |
| 2006/0038183 A1 | 2/2006 | Oliver |
| 2007/0228502 A1 | 10/2007 | Minamio et al. |
| 2009/0115875 A1 | 5/2009 | Choi et al. |

OTHER PUBLICATIONS

Republic of France, Search Report, dated Jul. 27, 2010 (2 pgs.).

*Primary Examiner* — W. David Coleman
(74) *Attorney, Agent, or Firm* — Marjama Muldoon Blasiak & Sullivan LLP (57) ABSTRACT

This method for producing a non-planar microelectronic component, especially a concave component, involves superposing a layer that contains an active flexible circuit above a cavity shaped according to the desired profile of said component, said cavity being formed in substrate; and applying a pressure difference either side of said layer thereby causing slumping of the flexible circuit into the cavity therefore causing the circuit to assume the shape of the cavity. Superposition of the flexible circuit and the cavity is realized by filling the cavity with a material capable of being selectively removed relative to the substrate and the flexible circuit; then fitting or forming the flexible circuit on the cavity thus filled; then forming at least one feedthrough to access the filled cavity; and by selectively etching the material that fills the cavity via at least one feedthrough in order to remove said material.

8 Claims, 9 Drawing Sheets

METHOD FOR PRODUCING A NON-PLANAR MICROELECTRONIC COMPONENT USING A CAVITY

CROSS REFERENCE TO RELATED APPLICATIONS

This application claims priority under 35 U.S.C. §119 from French Patent Application No. 0959340 filed on Dec. 22, 2009 in the French Patent Office, the entire disclosure of which is incorporated herein by reference.

FIELD OF THE INVENTION

The present invention relates to the production of curved, concave microelectronic components. It has particular applications in the field of image sensors.

DESCRIPTION OF THE PRIOR ART

Electronic imagers usually comprise a planar semiconductor image sensor made of silicon that uses CMOS or CCD technology and optics that form an image of the observed scene captured on the image sensor.

However, using a simple convex lens as an optic is unsatisfactory to the extent that the image formed by such a lens is not planar but spherical, a phenomenon that is referred to as "curvature of field". In fact, the image projected by a focusing lens on a planar sensor is either sharp in the centre but not sharp at its edges or the other way round. This explains, in particular, the manufacture of complex optics formed by sets of lenses that have also undergone special-purpose surface treatments in order to shape the images they produce to match the flatness of the sensor.

Nevertheless, even the most complex optics currently available still introduce a certain number of both geometrical and chromatic aberrations which include barrel distortion and pincushion distortion, spherical aberrations (or so-called "diffuse light" aberrations), coma, astigmatism, vignetting, blooming, spurious light (reflection) and even chromatic aberrations.

Such aberrations have to be corrected at the time when images are actually formed by using bulky, complex optics and/or subsequently by implementing image processing algorithms which demand considerable computing power. Thus, the planar nature of sensors is the direct cause of aberrations and correcting these requires bulky, expensive lenses and powerful on-board computers in cameras and digital cameras.

One effective way of eliminating errors caused by curvature of field is to modify the shape of the image sensor so that it is substantially the same shape as the image formed by the optics. The ability to curve the sensor therefore makes it possible not only to correct aberrations but also to design affordable cameras and compact cameras that do not require significant computing power.

The attractiveness of designing curved sensors in the field of imaging is therefore readily apparent.

Figure 1:
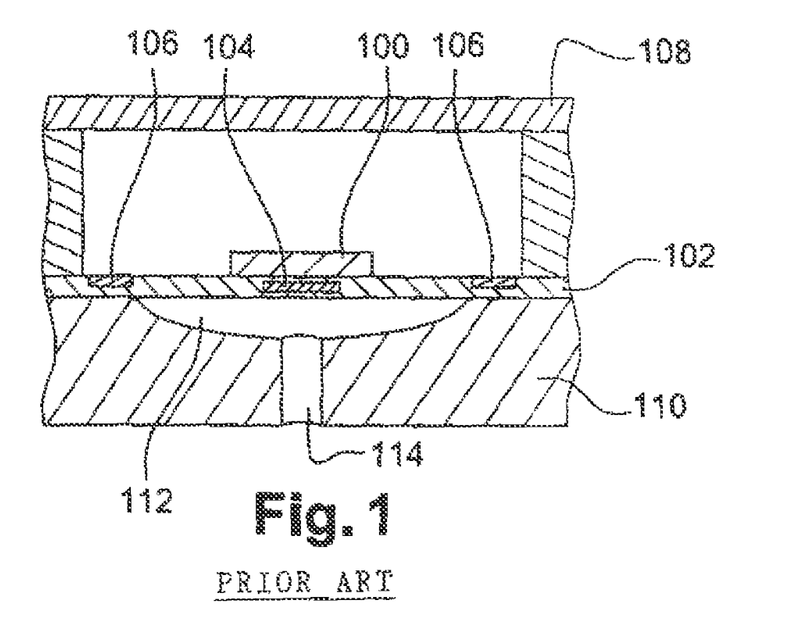
FIGS. 1 and 2 are schematic cross-sectional views of a back-side electronic imager during fabrication in accordance with a method according to the prior art.
Figure 2:
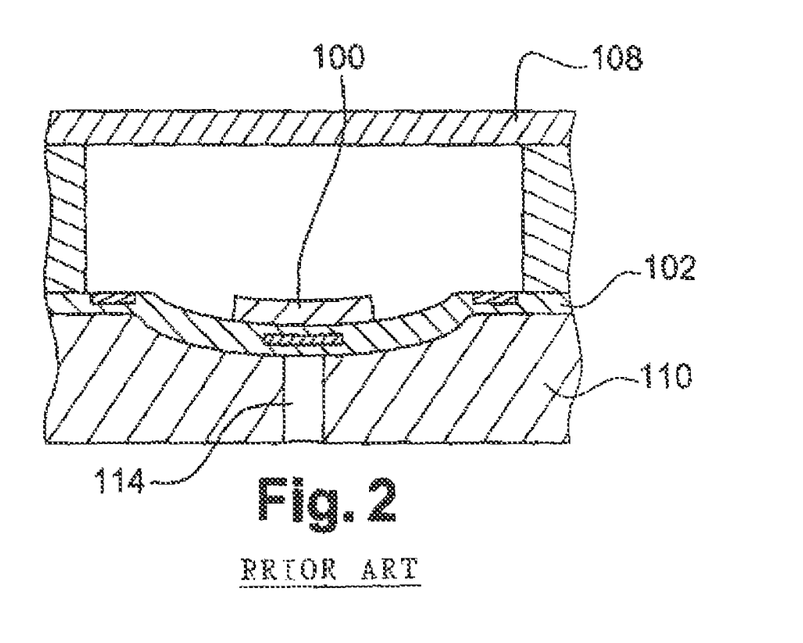

FIGS. 1 and 2 show a method for fabricating an imager with a concave sensor according to the prior art as described, for example, in document U.S. Pat. No. 7,390,687.

According to this method, a planar sensor 100 is initially produced on the surface of a substrate 102 in which a readout circuit 104 of said sensor 100 and connections 106 are also realized; the entire device is encapsulated in a package 108 capable of subsequently accommodating optics (not shown). Planar sensor 100 and substrate 102 are made thinner to give them sufficient flexibility to be curved.

This assembly is then mounted on a second substrate 110 in which a concave cavity 112 is formed, this cavity has the ultimately sought-after shape of the sensor 100. A feedthrough 114 is also made from the rear face of substrate 110 to cavity 112.

Cavity 112 is then depressurized. This creates a pressure difference that causes sensor 100 and substrate 102 to slump into cavity 112. The latter thus assume the same shape as cavity 112 and substrate 102 is attached to cavity 112 thanks to the presence of a film of adhesive previously deposited in cavity 112.

However, substrate 102 and sensor 100 are separately fitted on substrate 110 whereas cavity 112 is already formed. Before they are shaped to match the cavity, substrate 102 and sensor 100 therefore have no support.

In fact, it is difficult or even impossible to modify substrate 102 and sensor 100 once they have been fitted on cavity 112. For example, it is difficult to add new elements such as a protective layer or microlenses to substrate 102 or to sensor 100. In fact, modifying substrate 102 and sensor 100 necessarily involves applying pressure to them regardless whether such modification is mechanical (polishing, bonding, etc.), chemical (vacuum deposition, plasma etching, etc.) or physical (photolithography). Substrate 102 and sensor 100 therefore curve over cavity 112, making it awkward to modify them using conventional methods. Furthermore, variation in the pressure difference applied to substrate 102 and sensor 100 causes them to vibrate, still making any modification awkward.

In order to overcome these drawbacks, there is a need to monitor the pressure difference to which they are subjected very precisely in order to keep them flat at all times, but this proves to be impossible without accurately knowing the pressure exerted by the methods.

Thus, the method according to the prior art described above does not make it possible to modify substrate 102 and sensor 100 once they have been fitted on cavity 112. The latter have to be produced in their definitive state before they are fitted. In particular, they must be fitted while they are flexible because of their reduced thickness. This therefore imposes considerable constraints during the imager's fabrication process.

What is more, electronic circuits made of silicon are usually only flexible if they are less than 50 µm thick. With such thicknesses, they are awkward to grip and any manipulation error can result in undesirable creasing or twisting. In addition, in the example of the method explained above, substrate 102 and sensor 100 are attached to package 108 in order to facilitate handling them, thus improving ease of handling, but the package is an obstacle to subsequent modification of the imager once substrate 102 and sensor 100 have been shaped to match cavity 112.

SUMMARY OF THE INVENTION

The object of the present invention is to solve the above-mentioned problems by proposing an alternative method for producing a non-planar microelectronic component, especially a concave component, by using a subsequently shaped cavity and by applying a pressure difference that substantially reduces the stresses imposed by producing dishing and allows easy handling of the component at all times during its fabrication.

To achieve this, the object of the invention is a method for fabricating a non-planar microelectronic component, especially a concave component, that involves superposing a layer that includes an active flexible circuit above a cavity shaped to match the profile that one wishes to give said component, formed in a substrate, and applying a pressure difference either side of said layer, thereby causing the flexible circuit to slump into the cavity and hence assume the shape of the cavity.

According to the invention, the flexible circuit is superposed on the cavity by previously filling the cavity with a material capable of being selectively removed relative to the substrate and the flexible circuit; then fitting or forming the flexible circuit on the cavity thus filled; then forming at least one feedthrough to access the filled cavity; and by selectively etching the material that fills the cavity through at least one access feedthrough in order to remove said material.

In other words, once the cavity has been filled, the substrate that accommodates it has substantially the same mechanical properties as a solid substrate. Because of this, all the constraints associated with the cavity before the material that fills the cavity is etched disappear. In particular, it is possible to opt to produce the flexible circuit right on the substrate by using conventional methods, to fit the flexible circuit once it has been fabricated or to fit a thick block comprising the flexible circuit and then use classic methods in order to make this block thinner. It is even possible to modify the flexible circuit once it has been superposed on the substrate because it rests on a solid surface.

The term "flexible circuit" here is taken to mean a circuit that is capable of being deformed without this causing any alteration in its structure. Typically, this flexibility is a result of the thickness of the layer that contains the circuit and, because silicon is involved, the maximum thickness of this layer is 50 µm.

The term "concave" here is taken to mean a dish-shaped space.

For example, the flexible circuit consists of a conventional CMOS circuit thinned to a thickness of 2 to 50 µm making it possible to obtain curvature of the thinned substrate with a deflection of 10 to 200 µm at atmospheric pressure.

One or more feedthroughs can also be formed once the flexible circuit has been superposed on the cavity or the flexible circuit may comprise openings that allow access to the material that fills the cavity.

According to the particular embodiments of the invention, the method comprises one or more of the following aspects.

The material that fills the cavity is resin that is capable of being removed by an oxygen plasma.

The flexible circuit is bonded on the substrate by molecular bonding. In particular the flexible circuit is covered in a silicon oxide layer; the substrate is covered in a silicon oxide layer once the cavity has been formed and filled; the flexible circuit is fitted on the substrate, with the silicon oxide layer of the flexible circuit being deposited on the silicon oxide layer of the substrate; and the silicon oxide layers are heated.

Heating makes it possible, in particular, to strengthen the molecular bonding.

At least one feedthrough is blocked by taking care to subject the cavity to a first pressure, for example a vacuum or a reduced pressure, the pressure difference being obtained by then subjecting the assembly to a second pressure that exceeds the initial pressure.

According to one particular embodiment of the invention, the slumped flexible circuit is attached to the cavity. In particular, the bottom of the cavity is covered in a first material and the surface of the material that fills the cavity is covered in a second material, said first and second materials been capable of forming a eutectic system. Once the material that fills the cavity has been removed, the flexible circuit is attached to the cavity by bringing the component to the eutectic temperature of the eutectic system.

The microelectronic component is an image sensor. However, the invention is applicable to any type of microelectronic component that one wishes to curve.

BRIEF DESCRIPTION OF THE DRAWINGS

The invention will be made more readily understandable by reading the following description which is given merely by way of example and relates to the accompanying drawings in which identical references denote identical or analogous components and in which.

DESCRIPTION OF PREFERRED EMBODIMENTS

A method for fabricating a back-side electronic imager having a concave image sensor is described below.

The method starts (FIGS. 3A and 3B) by forming a thick silicon substrate 12 on which a layer of $SiO_2$ 14 having a thickness of 0.05 to 1 micrometer is deposited. Layer 14 will ultimately be used as a barrier layer when substrate 12 is thinned, as explained below in greater detail.

Figure 3A:
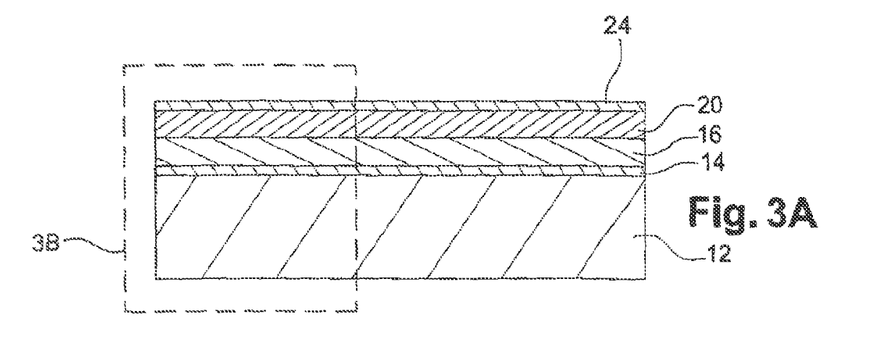
FIGS. 3 to 19 are cross-sectional views of an electronic imager during various stages of its fabrication using the method according to the invention.
Figure 3B:
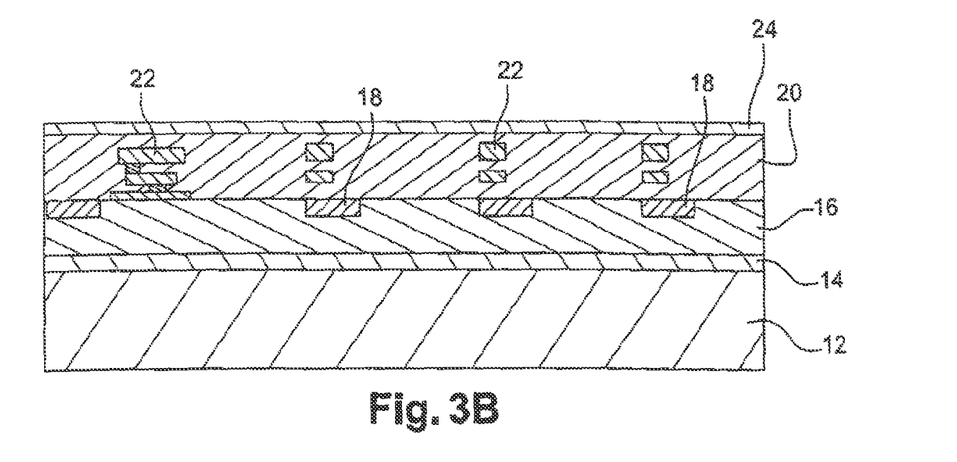

A silicon detection circuit 16 having a thickness of 2 to 5 µm is formed on layer 14 and comprises unitary detection elements 18 (phototransistors or photodiodes for example), or "pixels", as well as the imager's electronic analogue and logic processing components. This therefore constitutes the active circuit in the sense of the invention.

Metallic interconnections 22 for reading and polarizing the components of circuit 16 are produced on circuit 16, these interconnections are surrounded by a dielectric such as SiO that forms layer 20 which has a thickness of 1.5 to 4 µm.

Finally, a layer of silicon oxide SiO 24 having a thickness of 1 to 5 µm is deposited on dielectric layer 20 which contains the interconnections. Layer 24 is then planarized, for example by mechanical chemical polishing, in order to allow subsequent molecular bonding with another substrate referred to as the "grip substrate", as explained below in greater detail.

For example, detection circuit 16 is a rectangular circuit having dimensions of 1 to 5 mm and comprises an array of pixels having a side dimension of 1 to 10 µm giving a total number of between 300,000 and 12,000,000 pixels.

Note that detection circuit 16 and dielectric layer 20 comprising the interconnections are conventional and define the functional layers of the imager's image sensor. Note that any type of sensor and technology (CMOS, CCD) can be implemented here, the choice being dictated by the intended application. Consequently, detection circuit 16 and dielectric layer 20 comprising the interconnections will not be explained in greater detail below. It should simply be noted that the thickness of elements 16 and 20 makes them flexible.

Figure 4:
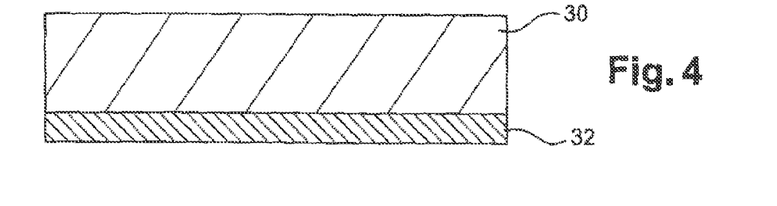

The method also includes forming a silicon substrate, referred to as the "grip" substrate 30, on which a layer of resin 32 having a thickness of 10 to 100 μm, for example, is deposited (FIG. 4).

Figure 5:
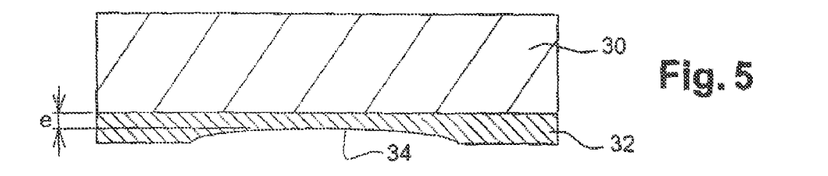

A concave cavity 34 is then formed in resin 32 by using a convex die, the shape whereof is a "negative" of the desired shape for detection circuit 16 (FIG. 5). The thickness of resin layer 32 is chosen to ensure that its residual thickness e once the cavity has been formed is as thin as possible, for instance around 1 μm.

Figure 6:
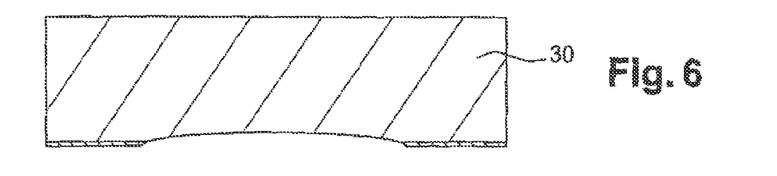

Ion-beam etching is then performed on resin layer 32 with a resin/silicon selectivity substantially equal to 1. The shape of cavity 34 impressed in resin layer 32 is thus transferred to silicon layer 30 in order to produce a concave cavity 36 in layer 30 (FIG. 6). If the etching selectivity equals 1, cavity 34 is precisely transferred to layer 30. Alternatively, the shape of cavity 34 is transferred and amplified by selecting a selectivity less than 1 or attenuated by selecting a selectivity greater than 1. In such a case where a selectivity other than 1 is chosen, the shape of the die that forms cavity 34 in resin layer 32 and the thickness of this layer are adapted in order to obtain the desired final shape of detection circuit 16 in silicon layer 30.

The residual resin is then removed from layer 30 and thermal oxidation of layer 30 is performed over thickness 38 from 50 nm to 0.5 micrometer, for example, in an oxidation furnace.

Figure 7:
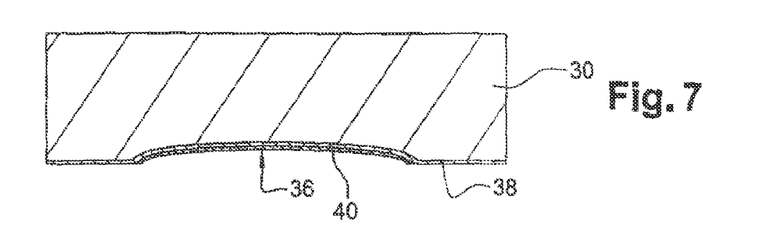

A metal layer 40 having a thickness of 100 nm to 1 micrometer is then deposited in cavity 36 (FIG. 7). This metal is, for example, deposited over the entire surface area of layer 38 and then the metal deposited outside of cavity 36 is removed in an appropriate way, for instance by using masking followed by selective chemical etching relative to silicon oxide 38 or by mechanical chemical polishing.

The metal in layer 40 constitutes one of the components of a eutectic system that will make it possible to subsequently weld layer 24 to the bottom of a concave cavity as explained below in greater detail. The metals that form the eutectic system are selected so that the melting temperature of this system is less than the melting temperature of the fragile materials of the imager, especially the metal of the interconnections in layer 20 and the material of the microlenses that will subsequently be formed. For example, the metal of layer 40 is tin intended to be combined with gold in order to form a eutectic system having a melting temperature less than 240° C.

The method then continues (FIG. 8) by depositing a polyimide type resin 42 so to fill cavity 36 followed by removal of the resin deposited outside cavity 36 in order to expose silicon oxide layer 38 over the flat portion of layer 30.

Figure 8:
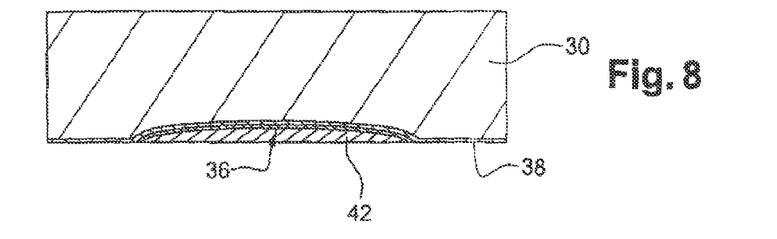

The assembly is then annealed at a temperature at least equal to the maximum temperature to which said assembly will be subjected during the remainder of the method according to the invention in order to preventively degas resin 42 contained in cavity 36.

Figure 9:
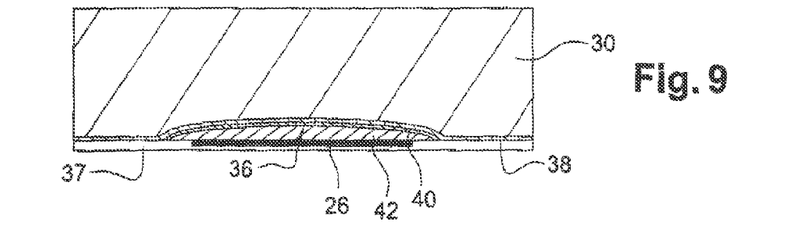

A metal layer 26 having a thickness of 100 nm to 1 micrometer is deposited in filling resin 42 (FIG. 9). The constituent metal of layer 26, for the eutectic system in question, complements the metal that constitutes metal layer 40. For example, if metal layer 26 is made of tin, metal layer 40 consists of gold. The gold/tin eutectic system obtained has a melting temperature of 200° C. to 240° C., depending on the relative proportions of these two materials.

A dielectric layer 37, made of SiO for example, having a thickness of 0.1 to 2 micrometers is then deposited at a temperature that is less than the previous annealing temperature in order to seal cavity 36.

The assembly that forms grip substrate 30 is then planarized, for instance by mechanical chemical polishing.

Figure 10A:
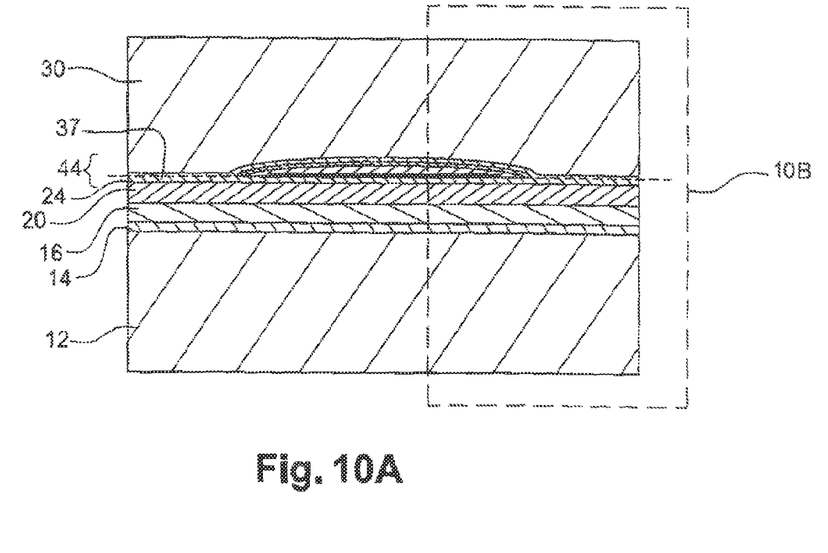
Figure 10B:
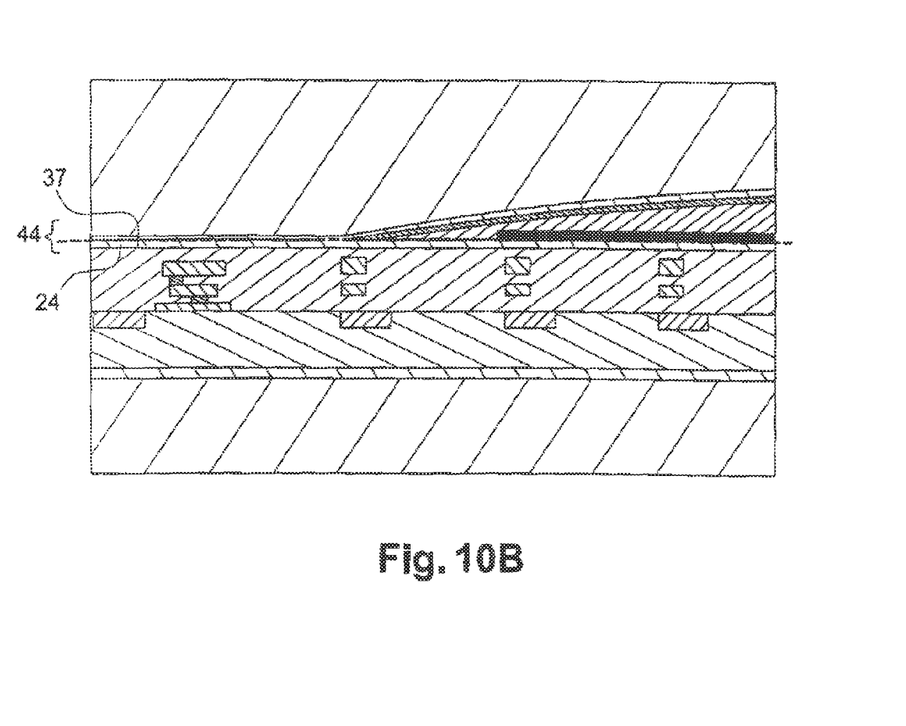

The assembly comprising detection circuit 16 and the assembly forming grip substrate 30 are then fitted one above the other so that silicon oxide layers 24 and 37 line up (FIGS. 10A and 10B).

Low-temperature molecular bonding of the layers is then performed in order to attach the two assemblies, this bonding is then strengthened by heating both assemblies to a temperature that is below the annealing temperature of resin 42. A single silicon oxide layer 44 is obtained in this way.

Substrate 12 placed underneath detection circuit 16 is then thinned (FIG. 11) in order to make it possible to obtain detection of electromagnetic radiation via the back side 46 of the imager, with $SiO_2$ layer 14 being used as a barrier layer during thinning of substrate 12.

Figure 11:
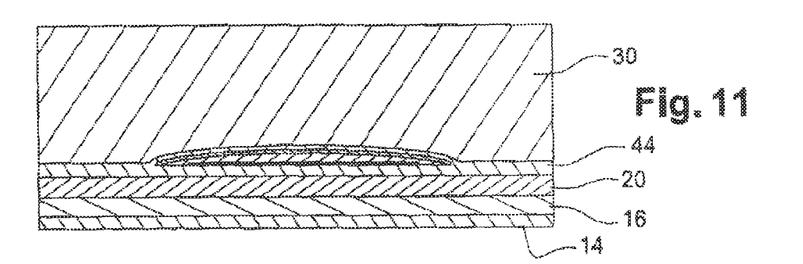

In the embodiment shown, substrate 12 is removed in its entirety. Detection circuit 16 having a thickness of 1 to 5 μm then captures photons in a manner that is known in itself from the prior art for back-side imagers.

Figure 12:
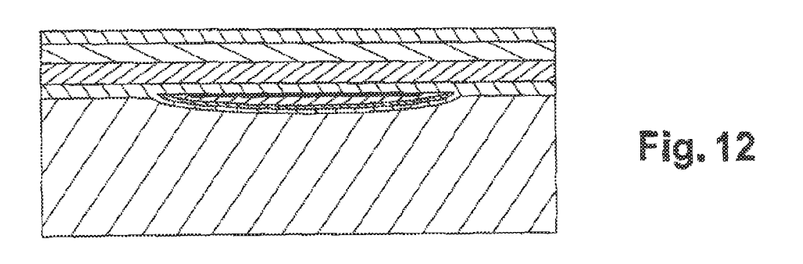

Once substrate 12 has been thinned, the assembly is then flipped over (FIG. 12).

The method then continues by finalizing the imager depending on the intended application.

Figure 13:
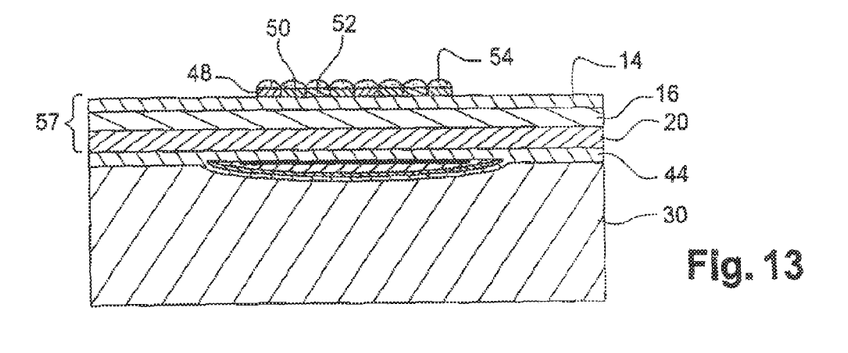

For example, if detection in the visible domain is required, the method continues by using photoetching to deposit beads of red resin 48, green resin 50 and blue resin 52 opposite the pixels of detection circuit 16 in order to define RGB detection mastering as is known in itself in the field of color detection. Microlenses 54 made of transparent resin are then made on resin beads 48, 50, 52 in order to focus the electromagnetic radiation on unitary detection elements 18 (FIG. 3B) of circuit 16 (FIG. 13). Microlenses 54 are then hardened by annealing at a temperature of 200° C. to 240° C.

Microlenses 54 are then protected by depositing unhardened resin 56 over the entire surface area 46 (FIG. 14), followed by removal of said resin away from the area of microlenses 54 in order to expose surfaces in which shafts will be formed as explained below. Deposition of silicon oxide at a low temperature below 150° C. is then performed in order to protect the resin deposited on microlenses 54.

Figure 14:
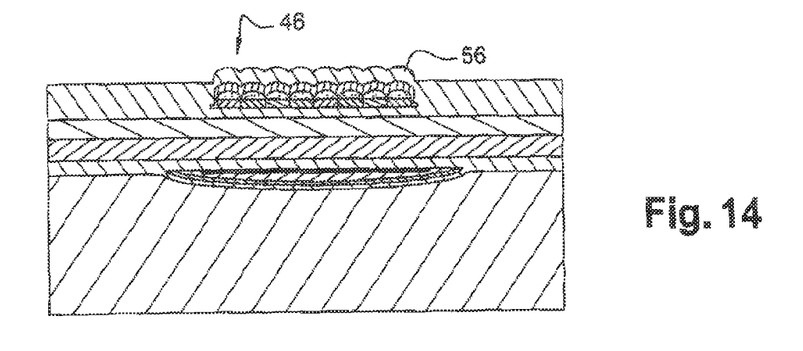

Note here that it is the solid nature of grip substrate 30 (cavity 36 being filled) that makes it possible to use conventional techniques to make substrate 12 thinner, to produce resin beads 48, 50, 52 by photolithography and to produce microlenses 54.

Once the detection and optical part 57 of the imager has been finalized, the method continues by curving this part 57.

Figure 15A:
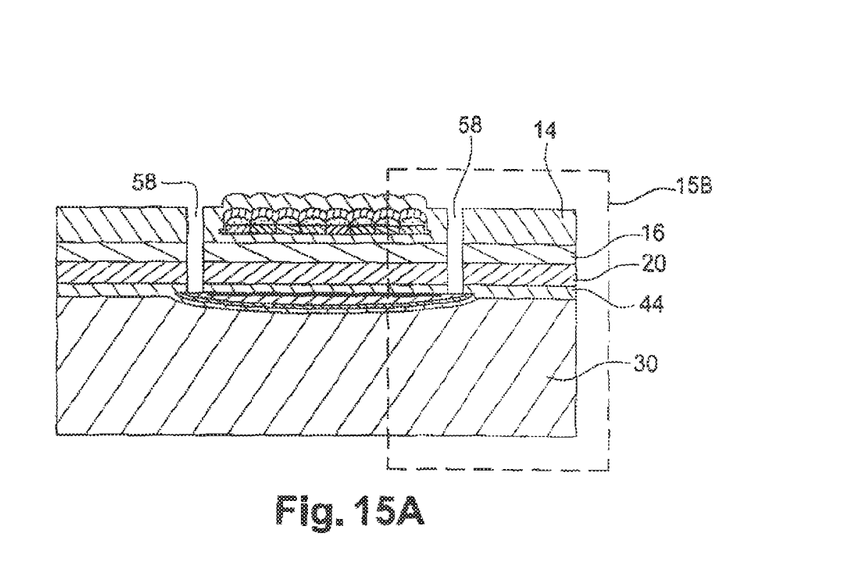
Figure 15B:
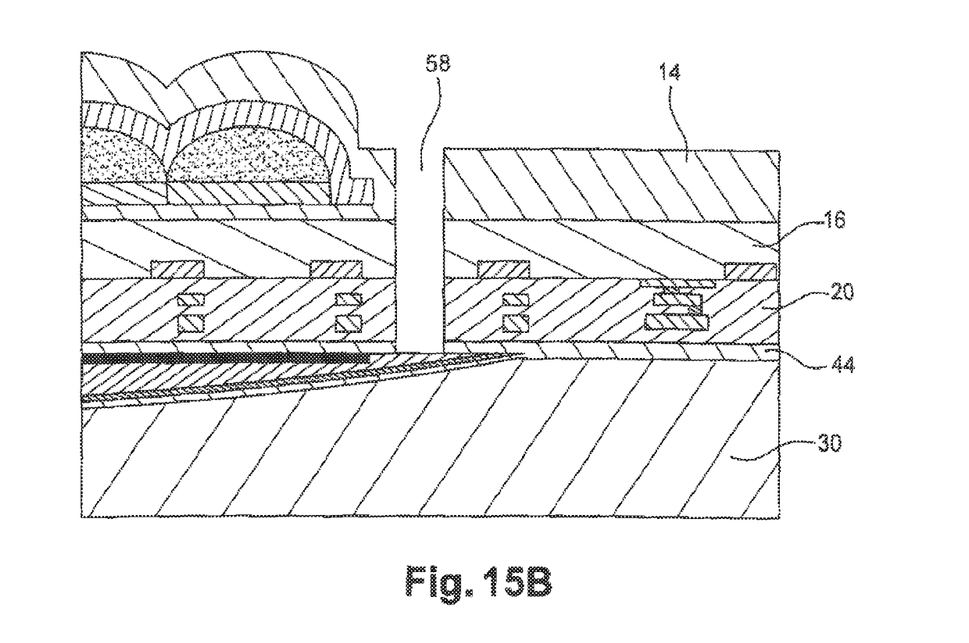

More especially, drain shafts 58 are formed by photoetching through layer 14 of circuit 16, layer 20 and layer 44 as far as cavity 36 and, more especially, resin 42 that fills it. Shafts 58 are formed around the periphery of the pixels of circuit 16 and have a diameter selected to allow subsequent stopping up without difficulty. For example, the diameter of shafts 58 is 400 nm to 2 micrometers.

Once shafts 58 are formed, selective etching of resin 42 is performed, especially using an oxygen plasma fed as far as said resin by shafts 58. This oxygen plasma is known to interact with organic compounds such as resin or polyamide, thereby creating volatile compounds that escape via shafts 58. Resin 42 that fills cavity 36 is then entirely removed from the cavity (FIG. 16).

Once cavity 36 has emptied, the pressure inside it is identical to the external pressure thanks to shafts 58. At this stage there is therefore no pressure difference between the cavity and the external environment regardless of the pressure of the latter.

Figures 16, 17A:
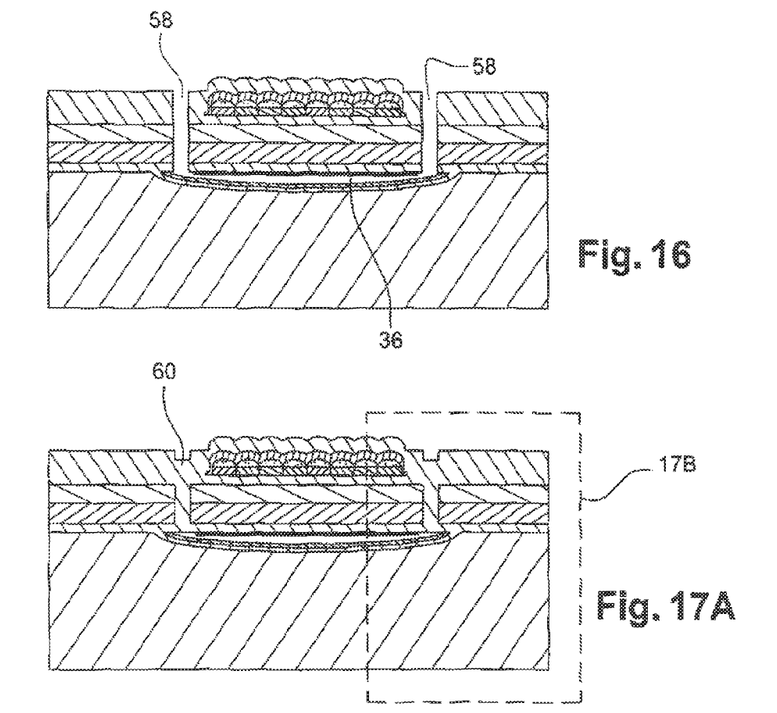
Figure 17B:
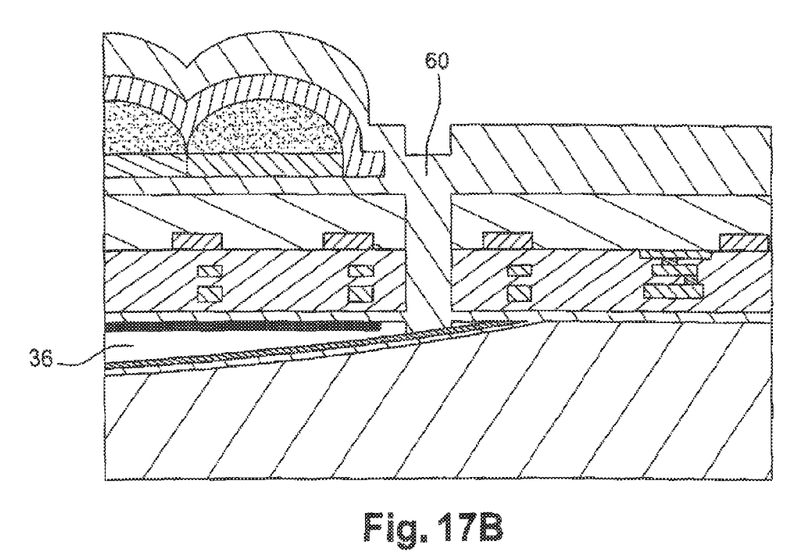

The method then continues by depressurizing the assembly and depositing silicon oxide 60 in a vacuum so as to stop up shafts 58 (FIGS. 17A and 17B).

Figure 18A:
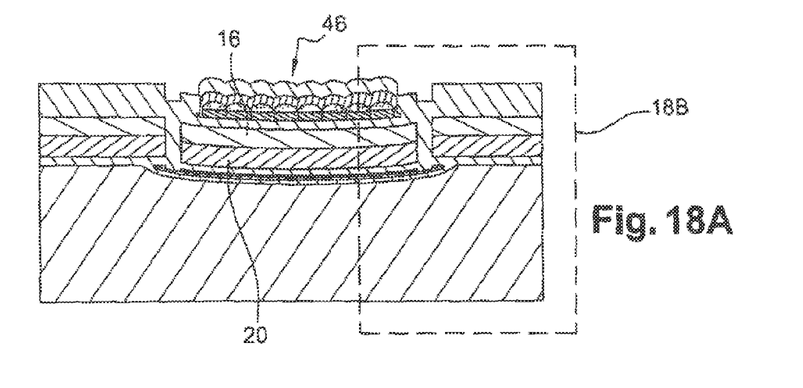
Figure 18B:
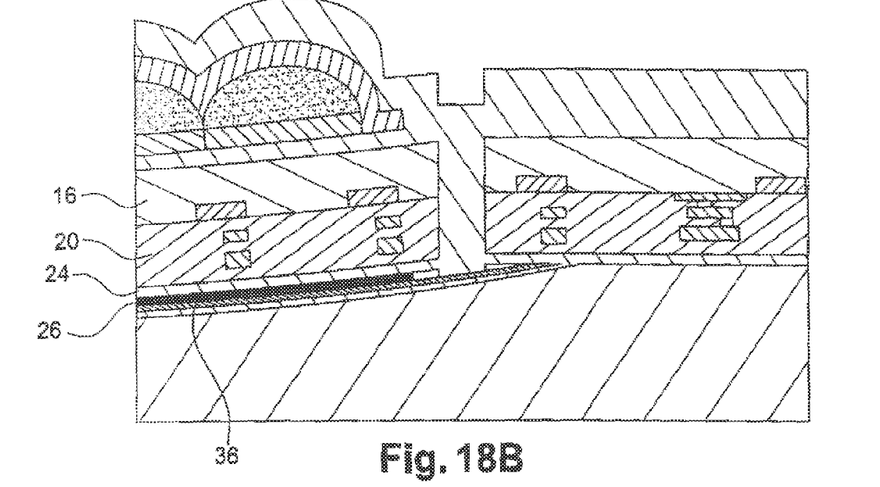

Once shafts 58 have been stopped up, the vacuum to which the assembly was subjected is broken, for example by re-establishing atmospheric pressure. This then causes slumping of the layers positioned above cavity 36 and causes them to assume the shape of cavity 36, especially that of detection circuit 16 (FIGS. 18A and 18B) because of the pressure difference between the vacuum inside cavity 36 when emptied of resin 42 and the atmospheric pressure exerted on surface 46.

Figure 19:
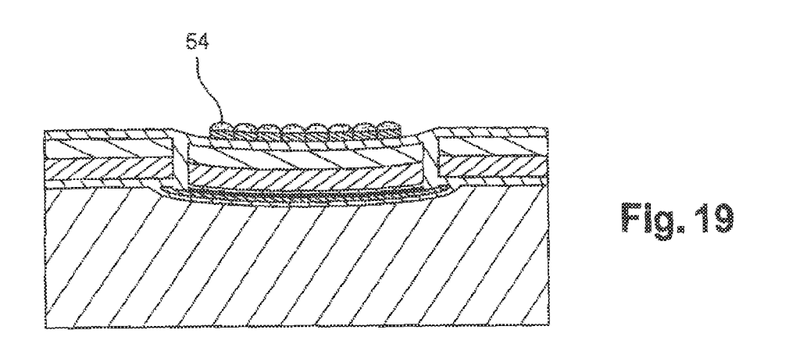

The method then continues by removing the protection deposited on microlenses 54 ($SiO_2$ and resin layer) by using photolithography. The resin is selectively removed from microlenses 54 because the latter have been annealed and therefore hardened at a temperature of at least 200° C. whereas the protective resin has been annealed at a temperature of 150° C. (FIG. 19).

The assembly is then raised to the melting temperature of the tin/gold eutectic system formed by layers 26 and 40, so that oxide layer 24, and consequently all the layers formed on top of the latter, are attached to the bottom of the cavity.

Figure 20:
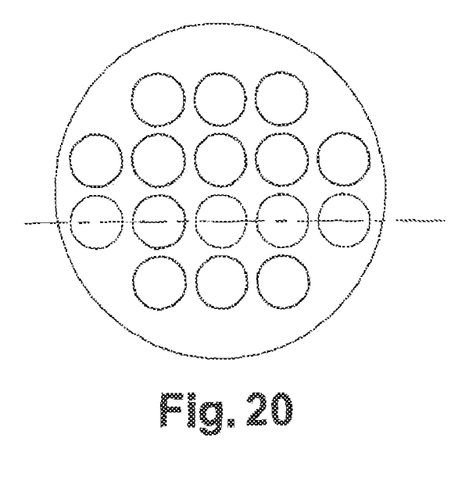
FIGS. 20 and 21 are, respectively, top views of a substrate in which several cavities are formed and a wafer comprising a plurality of image sensors for simultaneously fabricating several concave imagers.
Figure 21:
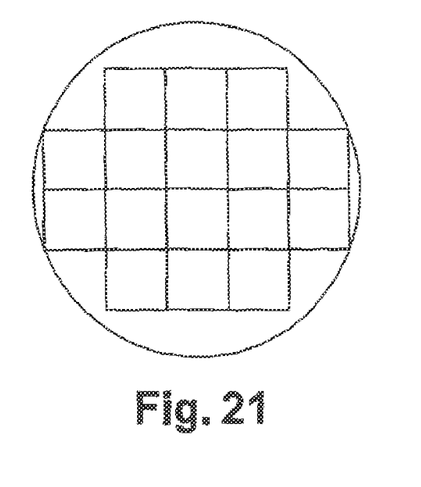

The formation of a concave sensor is described above. A plurality of concave sensors can, however, be produced simultaneously. For example, the grip substrate comprises a plurality of cavities, preferably circular cavities that are as close as possible to the desired spherical concave shape of the image sensors formed in the manner described above, as illustrated in FIG. 20. Accordingly, several detection circuit and their associated connections can be produced in a single element, as is shown in FIG. 21.

Figure 22:
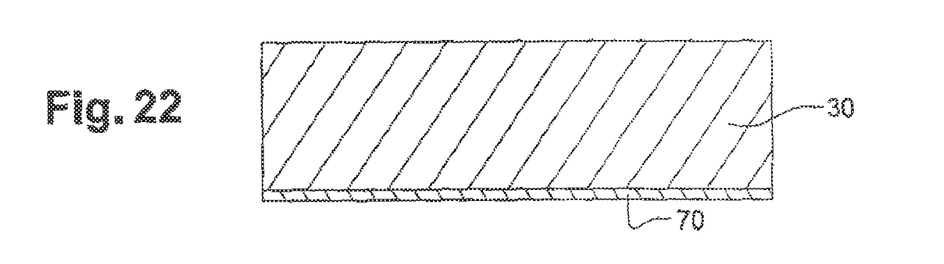
FIGS. 22 to 24 are cross-sectional views of a so-called grip substrate in one embodiment of a concave cavity.
Figure 23:
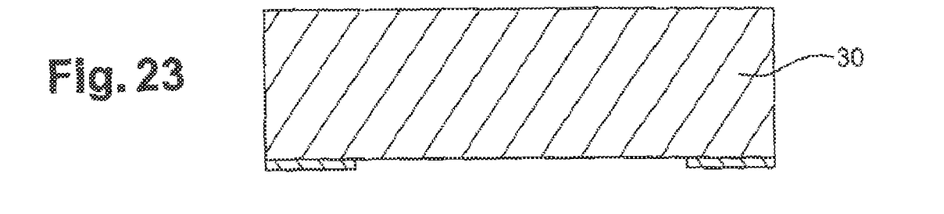
Figure 24:
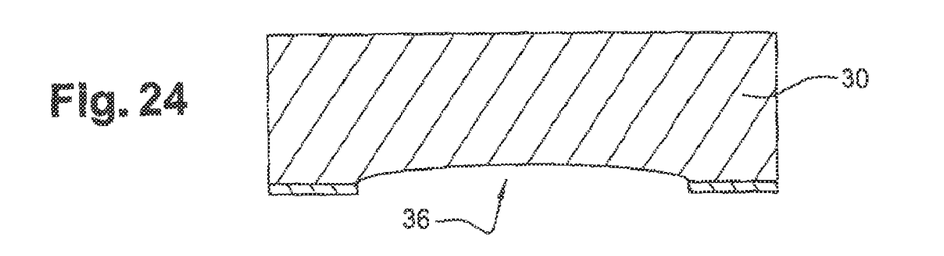

FIGS. 22 to 24 illustrate an alternative way of fabricating cavity 36. In this variant, a hard mask 70 having a thickness of 100 nm to 1 micrometer is formed on the surface of substrate 30 (FIG. 22). The hardness of mask 70 here is defined in terms of subsequent polishing which will not attack or only slightly attack said mask.

Mask 70 is then photoetched at the location where the cavity will be formed in substrate 30 (FIG. 23), then mechanical chemical polishing is performed. This type of polishing naturally produces a concave surface similar to the desired shape of the cavity when it is applied over a large surface area (FIG. 24).

The present invention is described in the context of fabricating an imager equipped with a concave sensor in the preceding text. It is readily apparent that the present invention can be applied to any type of electronic components that make it necessary to have a concave surface. Cavity 36, for example is flat and slopes at a predetermined angle relative to the plane of the grip substrate so that a planar circuit that slopes relative to the substrate is obtained. It is also possible to obtain micromirrors that are tilted relative to a reference surface.

The invention claimed is:

1. A method for producing a non-planar microelectronic component, especially a concave component, involving:
   superposing a layer that contains an active flexible circuit above a cavity shaped according to a desired profile of said component, said cavity being formed in a substrate; and
   applying a pressure difference either side of said layer thereby causing slumping of the flexible circuit into cavity therefore causing the flexible circuit to assume the shape of the cavity;
   wherein superposition of the flexible circuit and the cavity is realized:
      by filling the cavity with a material capable of being selectively removed relative to the substrate and the flexible circuit;
      then fitting or forming the flexible circuit on the cavity thus filled;
      then forming at least one feedthrough to access the filled cavity; and
      by selectively etching the material that fills cavity through at least one feed through in order to remove said material.

2. The method for producing a non-planar microelectronic component as claimed in claim 1, wherein material that fills the cavity is a resin capable of being removed by an oxygen plasma.

3. The method for producing a non-planar microelectronic component as claimed in claim 1, wherein the flexible circuit is bonded on the substrate by molecular bonding.

4. The method for producing a non-planar microelectronic component as claimed in claim 1, wherein at least one feed through is stopped up after subjecting the cavity emptied of material to a first pressure, a pressure difference being realized by subjecting the cavity to a second pressure that exceeds the first pressure.

5. The method for producing a non-planar microelectronic component as claimed in claim 1, wherein the flexible circuit is attached to the cavity after it has slumped.

6. The method for producing a non-planar microelectronic component as claimed in claim 1, wherein the microelectronic component is an image sensor.

7. The method for producing a non-planar microelectronic component as claimed in claim 3:
   wherein the flexible circuit is covered by a silicon oxide layer;
   wherein the substrate is covered by a silicon oxide layer once the cavity has been formed and filled;
   wherein the flexible circuit is fitted on the substrate, with silicon oxide layer of the flexible circuit deposited on silicon oxide layer of the substrate;
   and wherein the silicon oxide layers are heated.

8. The method for producing a non-planar microelectronic component as claimed in claim 5:
   wherein the bottom of the cavity is covered in a first material;
   wherein the surface of material that fills the cavity is covered by a second material, the first and the second material being capable of forming a eutectic system;
   and wherein once the material that fills the cavity has been removed, the flexible circuit is attached to the cavity by raising the component to an eutectic melting temperature of the eutectic system.

* * * * *

UNITED STATES PATENT AND TRADEMARK OFFICE
CERTIFICATE OF CORRECTION

| | | |
|---|---|---|
| PATENT NO. | : 7,935,559 B1 | Page 1 of 1 |
| APPLICATION NO. | : 12/913289 | |
| DATED | : May 3, 2011 | |
| INVENTOR(S) | : Giffard et al. | |

It is certified that error appears in the above-identified patent and that said Letters Patent is hereby corrected as shown below:

In the Claims:

(Column 8, Line 48). Please delete "as claimed in claim 5" and replace with -- as claimed in claim 6 --

Signed and Sealed this
Fourteenth Day of June, 2011

David J. Kappos
*Director of the United States Patent and Trademark Office*